(12) United States Patent
Park

(10) Patent No.: US 10,698,830 B2
(45) Date of Patent: Jun. 30, 2020

(54) OBTAINING DATA IN A NONVOLATILE MEMORY DEVICE THROUGH THE USE OF DESCRIPTORS

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 154 days.

(21) Appl. No.: 15/847,429

(22) Filed: Dec. 19, 2017

(65) Prior Publication Data

US 2019/0065386 A1 Feb. 28, 2019

(30) Foreign Application Priority Data

Aug. 28, 2017 (KR) .................. 10-2017-0108787

(51) Int. Cl.
| | | |
|---|---|---|
| *G06F 12/0877* | (2016.01) | |
| *G06F 13/16* | (2006.01) | |
| *G06F 3/06* | (2006.01) | |
| *G11C 16/04* | (2006.01) | |

(52) U.S. Cl.
CPC ........ *G06F 12/0877* (2013.01); *G06F 3/0611* (2013.01); *G06F 3/0656* (2013.01); *G06F 3/0659* (2013.01); *G06F 3/0679* (2013.01); *G06F 13/1673* (2013.01); *G06F 2212/60* (2013.01); *G06F 2212/7203* (2013.01); *G11C 16/0483* (2013.01)

(58) Field of Classification Search
None
See application file for complete search history.

(56) References Cited

U.S. PATENT DOCUMENTS 8,185,713 B2 * 5/2012 Shin .................. G06F 13/1668
711/167
2009/0259814 A1 * 10/2009 Inomata .............. G06F 13/1673
711/154

FOREIGN PATENT DOCUMENTS

| KR | 100598907 | 7/2006 |
| KR | 1020160110195 | 9/2016 |

* cited by examiner

*Primary Examiner* — Reginald G Bragdon
*Assistant Examiner* — James J. Thomas
(74) *Attorney, Agent, or Firm* — IP & T Group LLP

(57) ABSTRACT

A data storage device includes a nonvolatile memory device; and a controller including a descriptor generation unit, a memory controller and a buffer unit. The descriptor generation unit: transmits a first read descriptor for first data, to the memory controller, queues a first cache output descriptor for the first data, and transmits the first cache output descriptor to the memory controller by referring to a state of clusters included in the buffer unit. The memory controller transmits a first read command to the nonvolatile memory device based on the first read descriptor, and transmits a first cache output command to the nonvolatile memory device based on the first cache output descriptor.

18 Claims, 8 Drawing Sheets

OBTAINING DATA IN A NONVOLATILE MEMORY DEVICE THROUGH THE USE OF DESCRIPTORS

CROSS-REFERENCES TO RELATED APPLICATION

The present application claims priority under 35 U.S.C. § 119(a) to Korean application number 10-2017-0108787, filed on Aug. 28, 2017, which is incorporated herein by reference in its entirety.

BACKGROUND

1. Technical Field

Various embodiments generally relate to a data storage device. More particularly, various embodiments of the present disclosure relate to a data storage device including a nonvolatile memory device.

2. Related Art

A data storage device stores the data provided from an external device in response to a write request from the external device. Also the data storage device provides stored data to the external device in response to a read request from the external device. The external device as an electronic device capable of processing data includes a computer, a digital camera or a mobile phone. The data storage device may operate by being built in the external device, or may operate by being manufactured in a separable form and being coupled to the external device.

SUMMARY

In an embodiment, a data storage device may include: a nonvolatile memory device; and a controller including a descriptor generation unit, a memory controller and a buffer unit, wherein the descriptor generation unit transmits a first read descriptor for first data, to the memory controller, queues a first cache output descriptor for the first data, and transmits the first cache output descriptor to the memory controller by referring to a state of clusters included in the buffer unit, and wherein the memory controller transmits a first read command to the nonvolatile memory device based on the first read descriptor, and transmits a first cache output command to the nonvolatile memory device based on the first cache output descriptor.

In an embodiment, a method for operating a data storage device may include: transmitting a first read descriptor for first data, to a memory controller, and queueing a first cache output descriptor for the first data, by a descriptor generation unit; transmitting a first read command to a nonvolatile memory device based on the first read descriptor, by the memory controller; transmitting, by the descriptor generation unit, the first cache output descriptor to the memory controller by referring to a state of clusters included in a buffer unit; and transmitting, by the memory controller, a first cache output command to the nonvolatile memory device based on the first cache output descriptor.

In an embodiment a method for operating a data storage device may include: transmitting a first read descriptor for first data stored in a nonvolatile memory device, to a memory controller, and queueing a first cache output descriptor for the first data; determining whether a subsequent read operation on second data stored in the nonvolatile memory device is scheduled or not; and transmitting the first cache output descriptor to the memory controller by referring to a state of clusters included in a buffer unit when a subsequent read operation is not scheduled.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Figure 1:
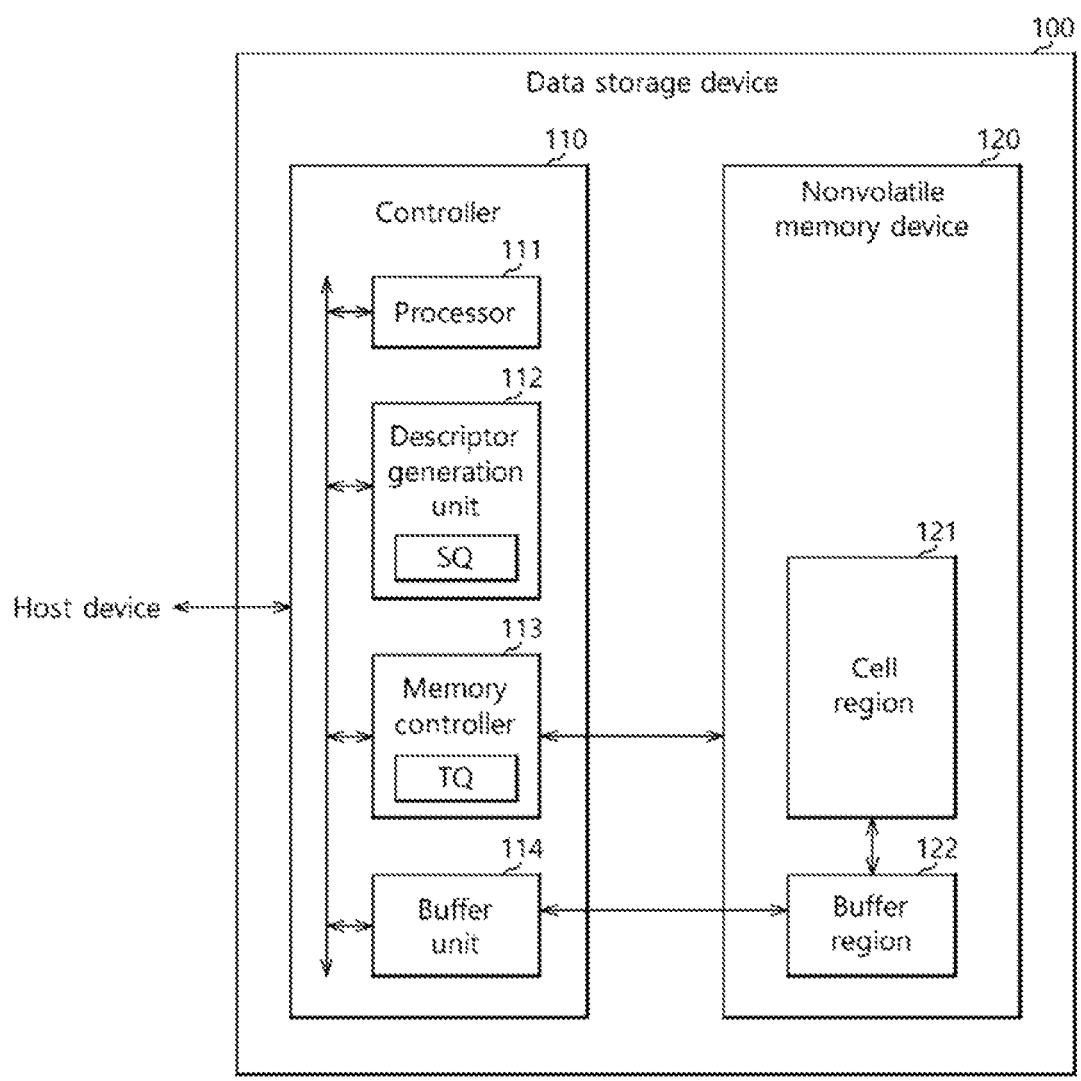
FIG. 1 is a block diagram illustrating a data storage device in accordance with an embodiment of the present disclosure.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example "at least one of A, B, and C" means, only A, or only B or only C, or any combination of A, B, and C.

The term "or" as used herein means either one of two or more alternatives but not both nor any combinations thereof.

As used herein singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data storage device 100 in accordance with an embodiment of the present disclosure.

The data storage device 100 may store data provided from a host device, in response to a write request from the host device. Also, the data storage device 100 may provide stored data to the host device, in response to a read request from the host device.

The data storage device 100 may be configured by, for instance, a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD), and the like.

The data storage device 100 may include a controller 110 and a nonvolatile memory device 120.

The controller 110 may control general operations of the data storage device 100. The controller 110 may store data in the nonvolatile memory device 120 in response to a write request transmitted from the host device, and may read data stored in the nonvolatile memory device 120 and transmit read data to the host device in response to a read request transmitted from the host device.

The controller 110 may include a processor 111, a descriptor generation unit 112, a memory controller 113, and a buffer unit 114.

The processor 111 may control the descriptor generation unit 112 to generate an appropriate descriptor according to an access request of the host device. Also, in order to perform an internal management operation of the data storage device 100 regardless of an access request of the host device, the processor 111 may control the descriptor generation unit 112 to generate an appropriate descriptor. The internal management operation may be performed to extend the lifetime and retain the optimal operational performance of the data storage device 100 and may include, for example, a garbage collection operation, a wear leveling operation, a read reclaim operation, and the like.

The descriptor generation unit 112 may generate and provide a descriptor to the memory controller 113 according to control of the processor 111. A descriptor may be a description for a command to be transmitted to a nonvolatile memory device. The descriptor transmitted to the memory controller 113 may be stored in an execution queue TQ of the memory controller 113.

Although the present embodiment shows the execution queue TQ inside the memory controller 113 for illustration purposes, the present disclosure is not limited thereto. That is, according to an embodiment the execution queue TQ may be separately positioned outside the memory controller 113. The descriptor generation unit 112 may store a descriptor in an external execution queue TQ, and may control the memory controller 113 to refer to the descriptor stored in the execution queue TQ. In the following description, an operation of the descriptor generation unit 112 to transmit a descriptor to the memory controller 113 may be understood as an operation of storing a descriptor in the separate execution queue TQ to allow the memory controller 113 to refer to the descriptor.

As will be described later, the descriptor generation unit 112 may generate, for example, a read descriptor and a cache output descriptor.

The descriptor generation unit 112 may include a suspension queue SQ. The suspension queue SQ may queue a cache output descriptor. The descriptor generation unit 112 may generate a read descriptor and a cache output descriptor to obtain the data stored in the nonvolatile memory device 120, transmit the read descriptor to the memory controller 113, and queue the cache output descriptor in the suspension queue SQ.)

The queued cache output descriptor of the suspension queue SQ may be transmitted to the execution queue TQ in succession to a second read descriptor, which comes after a first read descriptor, when the subsequent second read operation on the nonvolatile memory device 120 is scheduled. Further, the queued cache output descriptor of the suspension queue SQ may remain queued in the suspension queue SQ until it is determined that a number of free clusters in the buffer unit 114 remains unchanged for a predetermined time.

Although the present embodiment shows the suspension queue SQ inside the descriptor generation unit 112 for illustration purposes, the present disclosure is not limited thereto. That is, according to an embodiment, it is noted that the suspension queue SQ may be separately positioned outside the descriptor generation unit 112.

The memory controller 113 may generate a command based on the descriptor queued in the execution queue TQ working in a first-in-first-out (FIFO) manner, and may transmit the command to the nonvolatile memory device 120.

In detail, the memory controller 113 may generate a read command based on a read descriptor, and transmit the read command to the nonvolatile memory device 120. The nonvolatile memory device 120 may read data from a cell region 121 and buffer the data in a buffer region 122, in response to the read command.

Further, the memory controller 113 may generate a cache output command based on a cache output descriptor queued in the execution queue TQ, and transmit the cache output command to the nonvolatile memory device 120. The nonvolatile memory device 120 may output the data buffered in the buffer region 122, to the memory controller 113, in response to the cache output command.

Meanwhile, as described above, when transmitting a first read descriptor, which is now queued in the execution queue TQ, for first data stored in the nonvolatile memory device 120, to the memory controller 113, the descriptor generation unit 112 may queue a first cache output descriptor for the first data, in the suspension queue SQ. If a second read operation on second data stored in the nonvolatile memory device 120 is scheduled subsequently to the first read operation, the descriptor generation unit 112 may successively queue a subsequent second read descriptor for the second data and the first cache output descriptor for the first data in the execution queue TQ of the memory controller 113.

The memory controller 113 may successively transmit, based on the second read descriptor and the first cache output descriptor that are successively queued in the execution queue TQ, a second read command for the second data and a first cache output command for the first data, to the nonvolatile memory device 120. Accordingly, the nonvolatile memory device 120 may read out the second data from the cell region 121 to the buffer region 122 in response to the second read command, and at the same time, may transmit the first data buffered in the buffer region 122 to the memory controller 113, in response to the first cache output command.

In the meantime, if a second read operation on the nonvolatile memory device 120 is not scheduled subsequently to the first read operation and thus the queued first cache output descriptor remains queued in the suspension queue SQ, the first data may also remain buffered in the buffer region 122. Such a situation may delay the completion of the processing of a read request from the host device.

Also, when the data storage device 100 includes a plurality of nonvolatile memory devices, where one nonvolatile memory device 120 keeps buffering a read data among the plurality of nonvolatile memory devices, output of sequential read data in an order to the host device may be restricted, and the data storage device 100 may be placed under a stuck state.

According to the present embodiment, when predetermined execution condition is satisfied even though a subsequent second read operation on the nonvolatile memory device 120 is not scheduled, the descriptor generation unit 112 may transmit the first cache output descriptor, which is queued in the suspension queue SQ, to the memory controller 113 without a second read descriptor for a subsequent second read operation. In this case, the memory controller 113 may generate a first cache output command based on the first cache output descriptor, and transmit the first cache output command to the nonvolatile memory device 120 without a second read command. Accordingly, the nonvolatile memory device 120 may output the first data buffered in the buffer region 122, to the memory controller 113.

While not shown, the buffer unit 114 may include a plurality of clusters, and may temporarily buffer data to be transmitted between the host device and the nonvolatile memory device 120, in clusters. The buffer unit 114 may allocate clusters for processing an access request of the host device, according to a request of the processor 111. Clusters may be allocated by the size of data to be buffered.

When a read request of the host device is processed, the buffer unit 114 may buffer the data outputted from the nonvolatile memory device 120, in the clusters allocated to the read request, until the data is transmitted to the host device. After the data is outputted to the host device, that is, after the read request is completely processed, the clusters allocated to the read request may be cleared and become free.

The predetermined execution condition for processing the first cache output descriptor queued in the suspension queue SQ alone may be that the number of free clusters of the buffer unit 114 remains unchanged for a predetermined time.

In detail, when a first cache output descriptor queued in the suspension queue SQ remains queued, the descriptor generation unit 112 may determine whether a subsequent second read operation on the nonvolatile memory device 120 is scheduled or not. In other words, the descriptor generation unit 112 may determine whether a read access to the nonvolatile memory device 120 is instructed from the processor 111 or not.

When a subsequent second read operation on the nonvolatile memory device 120 is not scheduled, the descriptor generation unit 112 may refer to the state of the buffer unit 114, and may transmit, when the number of free clusters remains unchanged for a predetermined time, the first cache output descriptor queued in the suspension queue SQ, to the memory controller 113. When the number of free clusters increases/decreases, the descriptor generation unit 112 may keep the first cache output descriptor queued in the suspension queue SQ and may determine whether a subsequent second read operation on the nonvolatile memory device 120 is scheduled or not. If a subsequent second read operation on the nonvolatile memory device 120 is scheduled while the number of free clusters does not remain unchanged for a predetermined time, the descriptor generation unit 112 may generate a second read descriptor and a second cache output descriptor corresponding to the second read operation, and may successively transmit the second read descriptor and the queued first cache output descriptor to the memory controller 113.

According to an embodiment, when the number of free clusters of the buffer unit 114 remains unchanged for a predetermined time, the descriptor generation unit 112 may transmit the first cache output descriptor queued in the suspension queue SQ, to the memory controller 113. If the number of free clusters of the buffer unit 114 varies again within the predetermined time, the descriptor, generation unit 112 may keep the first cache output descriptor queued in the suspension queue SQ, and may determine whether a subsequent second read operation on the nonvolatile memory device 120 is scheduled or not.

A detailed method for operating the descriptor generation unit 112 and the memory controller 113 will be described later.

The nonvolatile memory device 120 may store the data transmitted from the controller 110 and may read stored data and output the read data to the controller 110, according to the control of the controller 110.

The nonvolatile memory device 120 may include the cell region 121 and the buffer region 122.

The cell region 121 may store data. Although not shown, the cell region 121 may include a plurality of memory cells. Each of the memory cells may store at least one data bit.

The buffer region 122 may buffer data to be stored in the cell region 121 and data to be outputted to the memory controller 113. The buffer region 122 may be realized by a volatile memory or a nonvolatile memory.

The nonvolatile memory device 120 may perform a read operation in response to a read command transmitted from the memory controller 113. That is, the nonvolatile memory device 120 may read data from the cell region 121 and buffer the read data in the buffer region 122 in response to the read command.

The nonvolatile memory device 120 may perform a cache output operation in response to a cache output command transmitted from the memory controller 113. That is, the nonvolatile memory device 120 may output the data buffered in the buffer region 122, to the memory controller 113, in response to the cache output command.

The nonvolatile memory device 120 may simultaneously perform a read operation and a cache output operation when a read command and a cache output command are successively transmitted. That is, the nonvolatile memory device 120 may read data from the cell region 121 in response to the read command, and at the same time, may output the data buffered in the buffer region 122, to the memory controller 113.

The nonvolatile memory device 120 may include a flash memory such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated in FIG. 1 that the data storage device 100 includes one nonvolatile memory device 120, the present disclosure is not limited thereto. That is, it is to be noted that the number of nonvolatile memory devices included in the data storage device 100 may be more than one.

Figure 2:
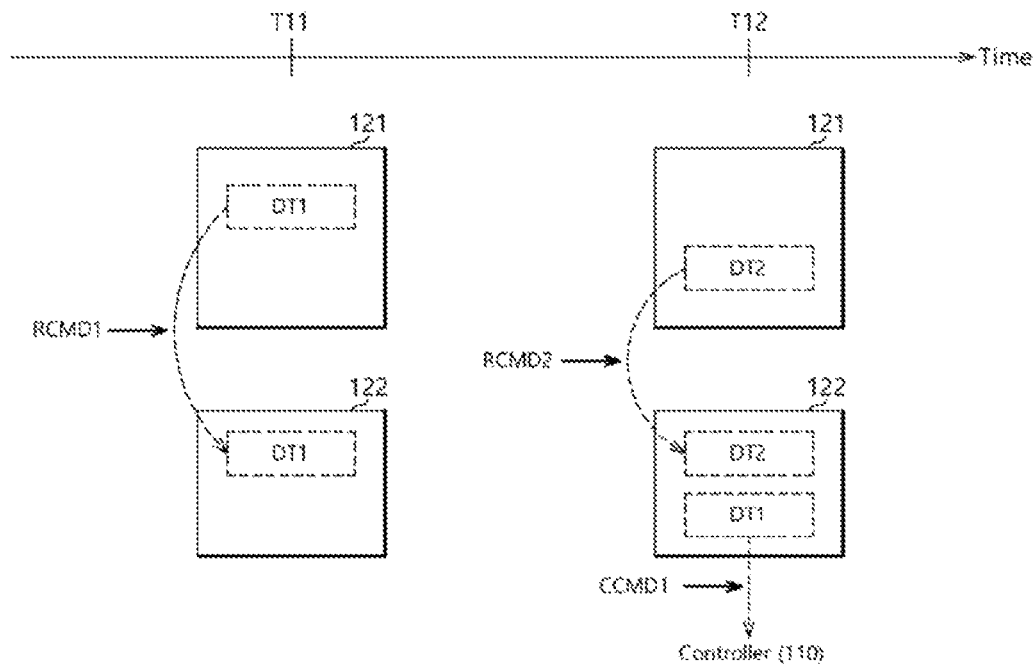
FIG. 2 is a diagram describing a method for a nonvolatile memory device simultaneously performing a read operation and a cache output operation in accordance with an embodiment.

FIG. 2 is a diagram describing a method for the nonvolatile memory device 120 simultaneously performing a read operation and a cache output operation in accordance with an embodiment.

Referring to FIG. 2, at a time T11, the controller 110 may transmit a first read command RCMD1 to the nonvolatile memory device 120. The nonvolatile memory device 120 may read first data DT1 from the cell region 121 and buffer the first data DT1 in the buffer region 122, in response to the first read command RCMD1.

At a time T12, the controller 110 may successively transmit a second read command RCMD2 and a first cache output command CCMD1 to the nonvolatile memory device 120. The nonvolatile memory device 120 may read second data DT2 from the cell region 121 in response to the second read command RCMD2, and at the same time, may output the first data DT1 to the controller 110 in response to the first cache output command CCMD1. Therefore, since a process of outputting the first data DT1 to the controller 110 and a process of reading the second data DT2 from the cell region 121 overlap, the read performance of the data storage device 100 may improve.

If the second read command RCMD2 to be transmitted to the nonvolatile memory device 120 does not exist, the nonvolatile memory device 120 may keep the first data DT1 buffered in the buffer region 122. If such a data cache state is prolonged, due to the completion of the processing of a read request from the host device being delayed, the latency characteristic of the data storage device 100 may deteriorate.

Figure 3:
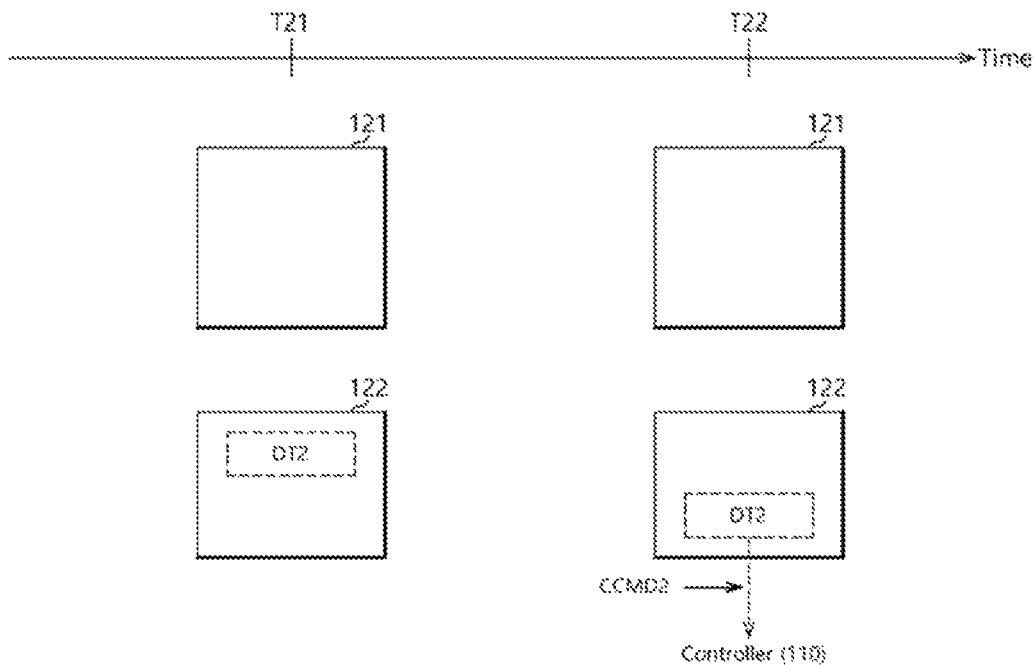
FIG. 3 is a diagram describing a method for the nonvolatile memory device performing a cache output operation in accordance with an embodiment.

FIG. 3 is a diagram describing a method for the nonvolatile memory device 120 performing a cache output operation in accordance with an embodiment.

Referring to FIG. 3, a time T21 may be, for example, a situation in which after the time T12 of FIG. 2, the second data DT2 is kept buffered in the buffer region 122.

At a time T22, when a subsequent third read operation on the nonvolatile memory device 120 is not scheduled, the controller 110 may transmit only a second cache output command CCMD2 to the nonvolatile memory device 120 without a subsequent read command depending on the predetermined execution condition based on the state of the buffer unit 114. The nonvolatile memory device 120 may output the second data DT2 to the controller 110 in response to the second cache output command CCMD2.

Figure 4:
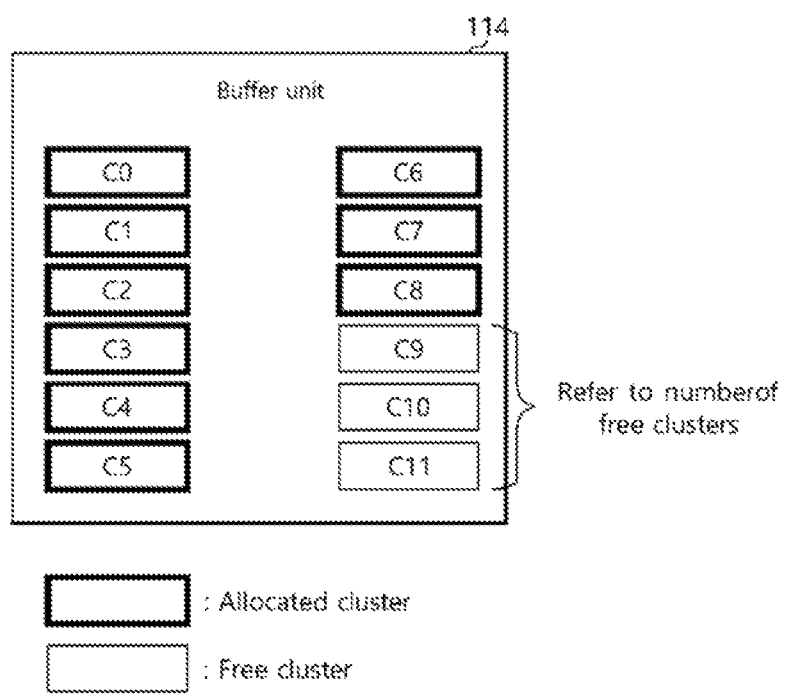
FIG. 4 is a diagram describing a method for the descriptor generation unit of FIG. 1, referring to the state of a buffer unit.

FIG. 4 is a diagram describing a method for the descriptor generation unit 112 of FIG. 1, referring to the state of the buffer unit 114.

Referring to FIG. 4, the buffer unit 114 may include, for example, total of 12 clusters C0 to C11. The buffer unit 114 may allocate dusters of an appropriate size to an access request of the host device, according to a request of the processor 111.

For example, the clusters C0 to C8 may be in a state allocated to the access request of the host device. The clusters C9 to C11 may be in a free state. Each of the clusters C0 to C8 may be cleared and become a free cluster after the associated access request is processed.

When a currently scheduled read operation on the nonvolatile memory device 120 does not exist and thus a queued cache output descriptor is not processed, the descriptor generation unit 112 may refer to the number variation of the free clusters C9 to C11 of the buffer unit 114. For example, the descriptor generation unit 112 may refer to whether the number of the free clusters C9 to C11 of the buffer unit 114 remains unchanged for a predetermined time. The descriptor generation unit 112 may request the buffer unit 114 to check a variation in the number of the free clusters C9 to C11.

When the number of the free clusters C9 to C11 among the clusters C0 to C11 remains unchanged for a predetermined time, the descriptor generation unit 112 may transmit the cache output descriptor queued in the suspension queue SQ to the memory controller 113 without a read descriptor of a subsequent read operation.

Meanwhile, when the number of the free clusters C9 to C11 among the clusters C0 to C11 increases or decreases, the descriptor generation unit 112 may keep the cache output descriptor queued in the suspension queue SQ. Since increase or decrease in the number of free clusters means that the data storage device 100 is not yet in a stuck state, the cache output descriptor can be kept queued. The descriptor generation unit 112 may continuously check whether the number of free clusters remains unchanged for a predetermined time. If a subsequent read operation on the nonvolatile memory device 120 is scheduled in the meantime, the descriptor generation unit 112 may successively transmit a read descriptor for the subsequent read operation and the cache output descriptor, which is currently queued in the suspension queue SQ, to the memory controller 113.

In other words, the fact that the number of the free clusters C9 to C11 remains unchanged for a predetermined time may mean that data is kept buffered in the nonvolatile memory device 120. Moreover, the fact that the number of free clusters C9 to C11 remains unchanged for a predetermined time may mean that not only the nonvolatile memory device 120, but also the other nonvolatile memory devices included in the data storage device 100 do not process data and thus the data storage device 100 is in a stuck state. Further, the fact that the number of the free clusters C9 to C11 remains unchanged for a predetermined time may mean that no throughput for the host device is currently produced. Therefore, since whether the queued state of a cache output descriptor is ended depends on the number of free clusters of the buffer unit 114 and consideration of the actually stuck state of the data storage device 100, the latency characteristic of the data storage device 100 may be effectively improved.

Figure 5:
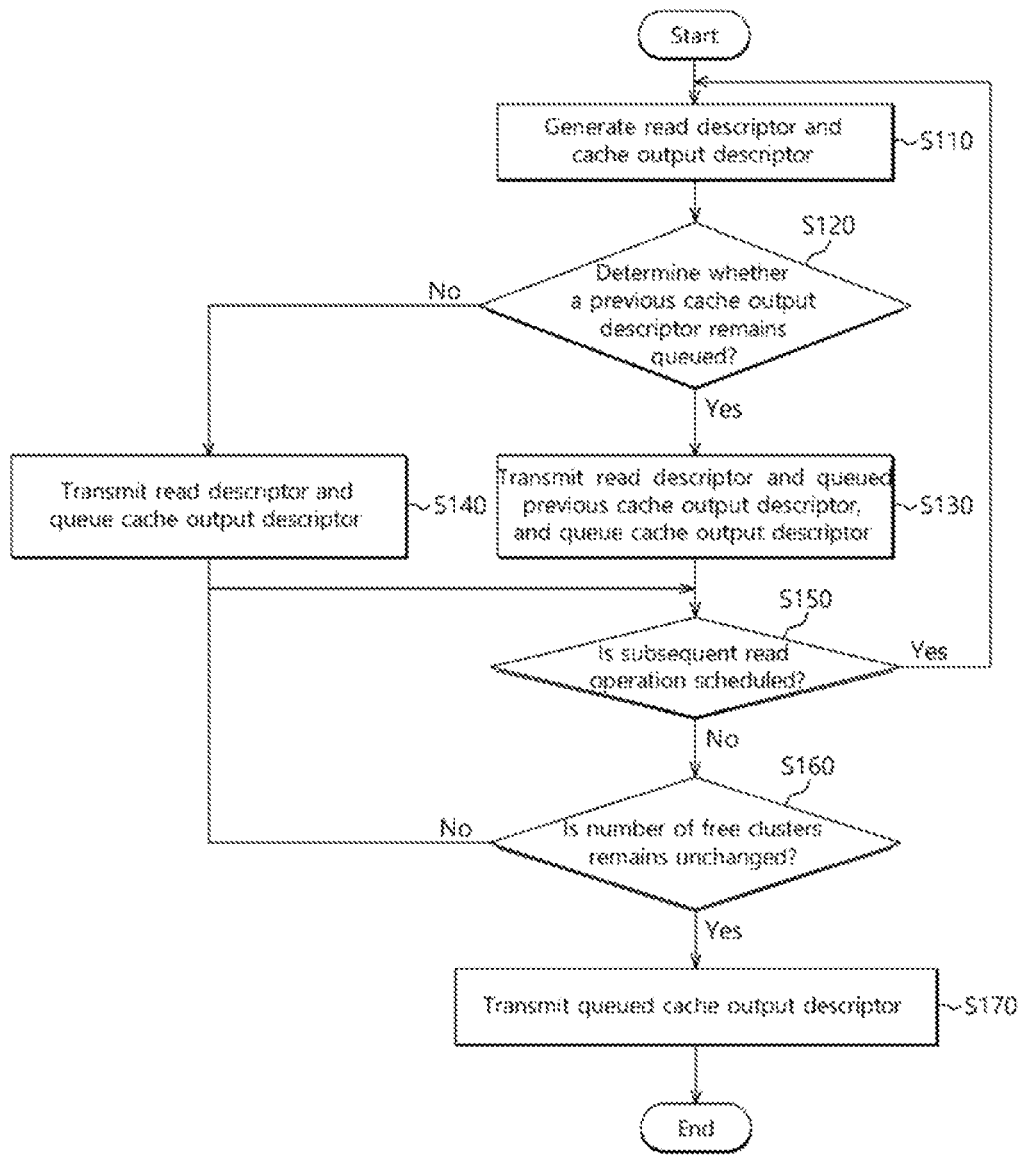
FIG. 5 is a flow chart describing a method for operating the data storage device of FIG. 1 in accordance with an embodiment.

FIG. 5 is a flow chart describing a method for operating the data storage device 100 of FIG. 1 in accordance with an embodiment.

Referring to FIG. 5, at step S110, the descriptor generation unit 112 may generate a read descriptor and a cache output descriptor according to an instruction of the processor 111 (shown in FIG. 1).

At step S120, the descriptor generation unit 112 may determine whether a previous cache output descriptor remains queued in the suspension queue SQ or not. When a previous cache output descriptor remains queued, the process may proceed to step S130.

At the step S130, the descriptor generation unit 112 may successively transmit the read descriptor generated at the step S110 and the queued previous cache output descriptor to the memory controller 113. The descriptor generation unit 112 may queue the current cache output descriptor generated at the step S110, in the suspension queue SQ.

Therefore, the memory controller 113 may successively transmit a read command and a cache output command to the nonvolatile memory device 120 based on the read descriptor and the previous cache output descriptor. The nonvolatile memory device 120 may read data from the cell region 121 to the buffer region 122 in response to the read command, and at the same time, may output the data buffered in the buffer region 122, to the controller 110, in response to the cache output command.

Meanwhile, when any previous cache output descriptor does not remain queued, the process may proceed to step S140.

At the step S140, the descriptor generation unit 112 may transmit the read descriptor generated at the step S110, to the memory controller 113, and may queue the cache output descriptor in the suspension queue SQ.

The descriptor transmitted to the memory controller 113 may be queued in the execution queue TQ, and the memory controller 113 may control the nonvolatile memory device 120 to perform an operation by generating a command according to the queued descriptor queued in the execution queue TQ in a FIFO manner. Accordingly, the memory controller 113 may transmit a read command to the nonvolatile memory device 120 based on the read descriptor. The nonvolatile memory device 120 may read data from the cell region 121 to the buffer region 122 in response to the read command.

At step S150, the descriptor generation unit 112 may determine whether a subsequent read operation on the nonvolatile memory device 120 is scheduled or not. When a subsequent read operation is scheduled, the process may proceed to the step S110.

However, when a subsequent read operation is not scheduled, the process may proceed to step S160.

At the step S160, the descriptor generation unit 112 may determine whether the number of free clusters of the buffer unit 140 remains unchanged for a predetermined time. When the number of free clusters does not remain unchanged for a predetermined time, the process may proceed to the step S150. That is, at the step S150, the descriptor generation unit 112 may determine again whether a subsequent read operation is scheduled or not.

Meanwhile, when the number of free clusters remains unchanged for a predetermined time at the step S160, the process may proceed to step S170.

At the step S170, the descriptor generation unit 112 may transmit the queued cache output descriptor to the memory controller 113.

Accordingly, the memory controller 113 may transmit a cache output command to the nonvolatile memory device 120 based on the cache output descriptor. The nonvolatile memory device 120 may output the data buffered in the buffer region 122, to the controller 110, in response to the cache output command.

Figure 6:
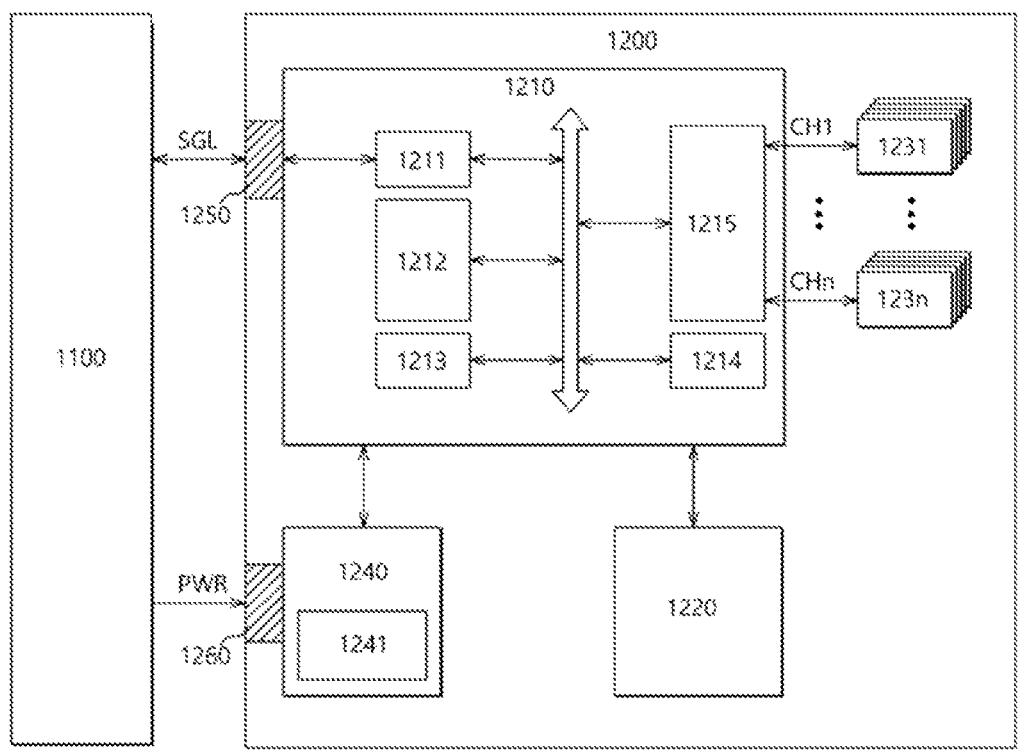
FIG. 6 is a diagram illustrating a data processing system including a solid state drive (SSD) in accordance with an embodiment.

FIG. 6 is a diagram illustrating a data processing system 1000 including a solid state drive (SSD) 1200 in accordance with an embodiment of the present disclosure. Referring to FIG. 6, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory (RAM) 1213, an error correction code (ECC) unit 1214, and a memory interface unit 1215.

The host interface unit 1211 may exchange a signal SGL with the host device 1100 through the signal connector 1250. The signal SGL may include a command an address data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E), and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The FCC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 7:
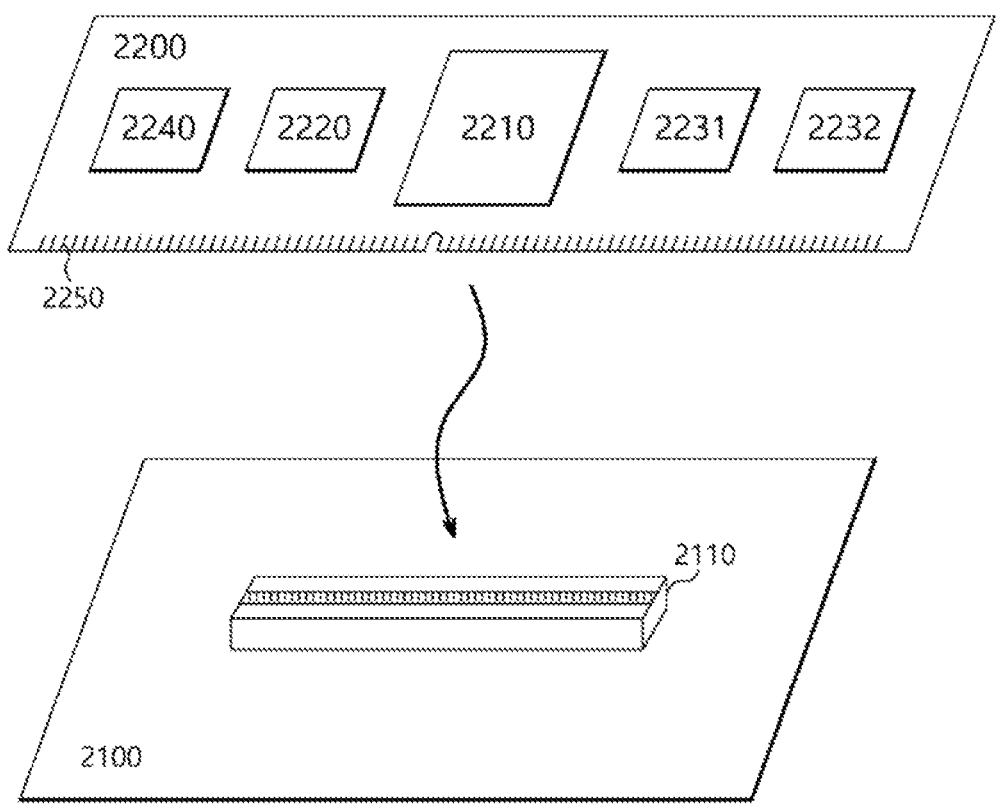
FIG. 7 is a diagram illustrating a data processing system including a data storage device in accordance with an embodiment.

FIG. 7 is a diagram illustrating a data processing system 2000 including a data storage device 2200 in accordance with an embodiment. Referring to FIG. 7, the data processing system 2000 may include a host device 2100 and the data storage device 2200.

The host device 2100 may be configured in the form of a board such as a printed circuit board (PCB). Although not shown, the host device 2100 may include internal function blocks for performing the function of a host device.

The host device 2100 may include a connection terminal 2110 such as a socket, a slot, or a connector. The data storage device 2200 may be mounted to the connection terminal 2110.

The data storage device 2200 may be configured in the form of a board such as a PCB. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 6.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data, and so forth, and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 8:
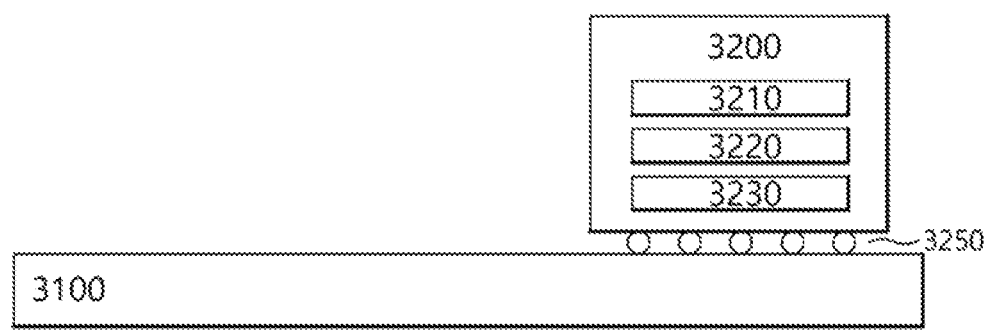
FIG. 8 is a diagram illustrating a data processing system including a data storage device in accordance with an embodiment.

FIG. 8 is a diagram illustrating a data processing system 3000 including a data storage device 3200 in accordance with an embodiment. Referring to FIG. 8, the data processing system 3000 may include a host device 3100 and the data storage device 3200.

The host device 3100 may be configured in the form of a board such as a PCB. Although not shown, the host device 3100 may include internal function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 6.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 9:
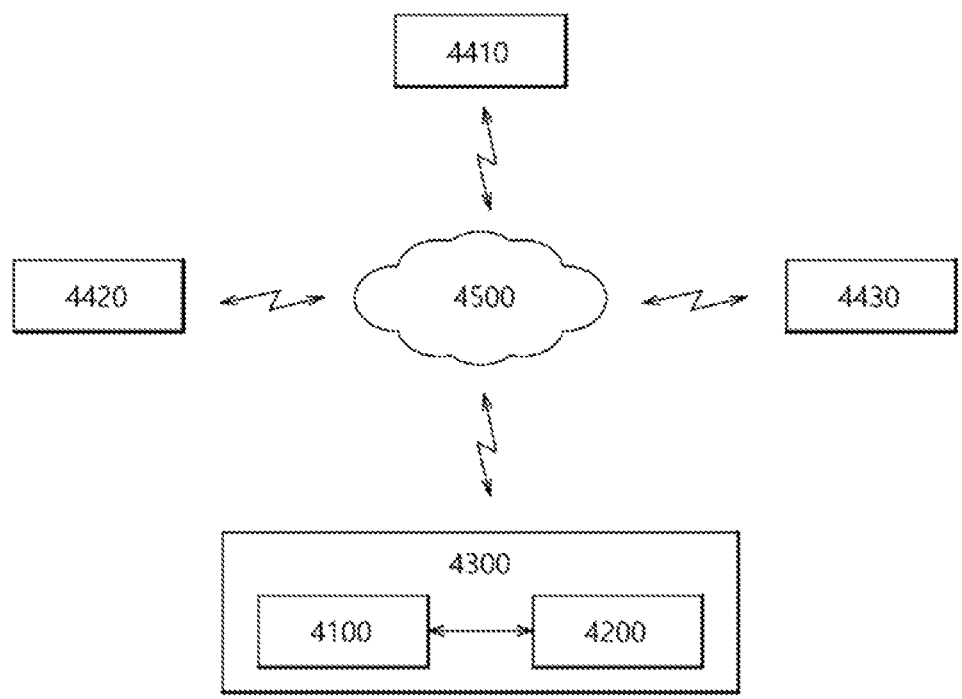
FIG. 9 is a diagram illustrating a network system including a data storage device in accordance with an embodiment.

FIG. 9 is a diagram illustrating a network system 4000 including a data storage device 4200 in accordance with an embodiment. Referring to FIG. 9, the network system 4000 may include a server system 4300 and a plurality of client systems 4410 to 4430, which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the data storage device 4200. The data storage device 4200 may be configured by the data storage device 100 shown in FIG. 1, the data storage device 1200 shown in FIG. 6, the data storage device 2200 shown in FIG. 7 or the data storage device 3200 shown in FIG. 8.

Figure 10:
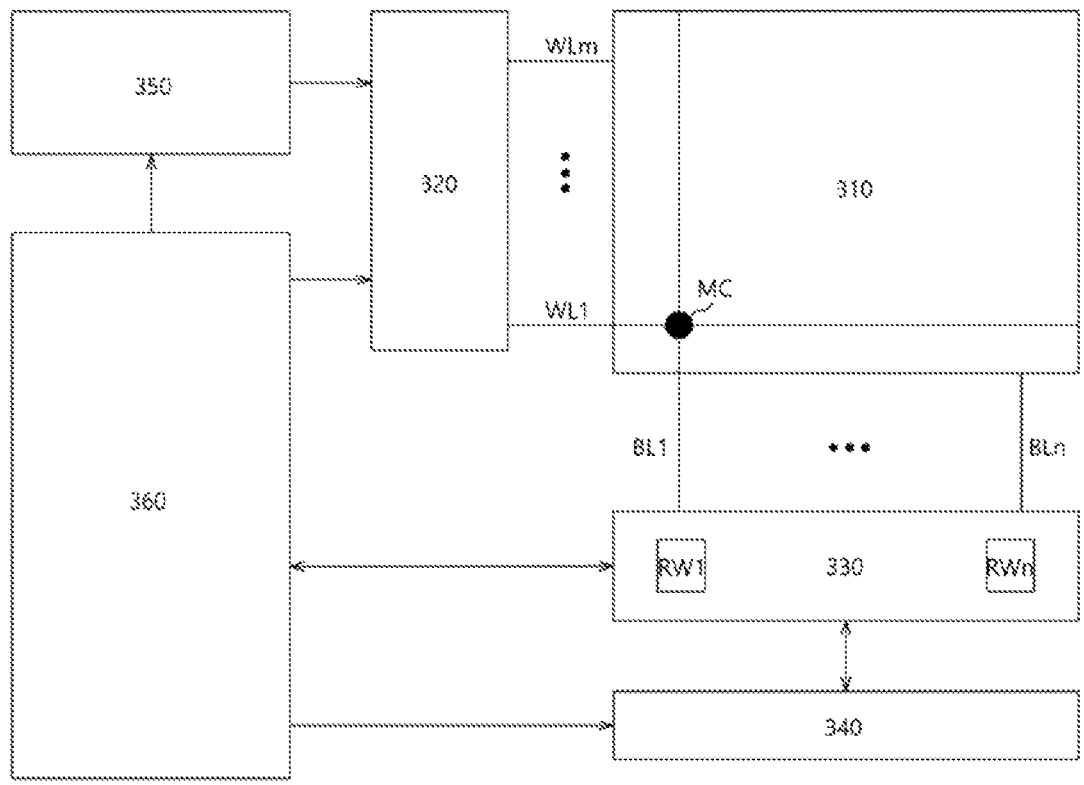
FIG. 10 is a block diagram illustrating a nonvolatile memory device included in a data storage device in accordance with an embodiment.

FIG. 10 is a block diagram illustrating a nonvolatile memory device 300 included in a data storage device in accordance with an embodiment. Referring to FIG. 10, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
a nonvolatile memory device;
a descriptor generator configured to generate a descriptor;
a memory controller configured to generate a command to be transferred, based on the descriptor, to the nonvolatile memory device; and
a buffer including a plurality of clusters,
wherein the descriptor generator generates both a first read descriptor and a first cache output descriptor to obtain first data stored in the nonvolatile memory device, queues the first cache output descriptor when transmitting the first read descriptor to the memory controller, and determines whether to transmit the first cache output descriptor to the memory controller by referring to a state of the clusters, and
wherein the memory controller transmits a first read command to the nonvolatile memory device based on the first read descriptor, and transmits a first cache output command to the nonvolatile memory device based on the first cache output descriptor.

2. The data storage device according to claim 1, wherein, before referring to the state of the clusters, the descriptor generator determines whether a subsequent read operation on the nonvolatile memory device is scheduled or not.

3. The data storage device according to claim 1, wherein the descriptor generator transmits the first cache output descriptor to the memory controller when a number of free clusters included in the buffer remains unchanged for a predetermined time.

4. The data storage device according to claim 3, wherein the descriptor generator keeps the first cache output descriptor queued when the number of free clusters does not remain unchanged for a predetermined time, and checks again the number of free clusters when a subsequent read operation on the nonvolatile memory device is not scheduled.

5. The data storage device according to claim 1, wherein, when a subsequent read operation on second data stored in the nonvolatile memory device is scheduled before referring to the state of the clusters, the descriptor generator successively transmits a second read descriptor for the second data and the first cache output descriptor to the memory controller.

6. The data storage device according to claim 5, wherein the memory controller successively transmits a second read command and the first cache output command to the nonvolatile memory device based on the second read descriptor and the first cache output descriptor.

7. The data storage device according to claim 6, wherein the nonvolatile memory device performs a read operation on the second data in response to the second read command when performing a cache output operation on the first data in response to the first cache output command.

8. A method for operating a data storage device, comprising:
generating, by a descriptor generator, both a first read descriptor and a first cache output descriptor to obtain first data stored in a nonvolatile memory device;

queueing, by the descriptor generator, the first cache output descriptor when transmitting the first read descriptor to a memory controller;

transmitting a first read command to the nonvolatile memory device based on the first read descriptor, by the memory controller;

determining, by the descriptor generator, whether to transmit the first cache output descriptor to the memory controller by referring to a state of clusters included in a buffer; and transmitting, by the memory controller, a first cache output command to the nonvolatile memory device based on the first cache output descriptor transmitted from the descriptor generator.

9. The method according to claim 8, further comprising:
determining, before referring to the state of the clusters, whether a subsequent read operation on the nonvolatile memory device is scheduled or not, by the descriptor generator.

10. The method according to claim 8, wherein the transmitting of the first cache output descriptor comprises:
transmitting, by the descriptor generator, the first cache output descriptor to the memory controller when a number of free clusters included in the buffer remains unchanged for a predetermined time.

11. The method according to claim 10, wherein the transmitting of the first cache output descriptor comprises:
keeping, by the descriptor generator, the first cache output descriptor queued when the number of free clusters does not remain unchanged for a predetermined time; and
checking again, by the descriptor generator, the number of free clusters when a subsequent read operation on the nonvolatile memory device is not scheduled.

12. The method according to claim 8, further comprising:
successively transmitting, when a subsequent read operation on second data stored in the nonvolatile memory device is scheduled before referring to the state of the clusters, a second read descriptor for the second data and the first cache output descriptor to the memory controller, by the descriptor generator.

13. The method according to claim 12, further comprising:
successively transmitting, by the memory controller, a second read command and the first cache output command to the nonvolatile memory device based on the second read descriptor and the first cache output descriptor.

14. The method according to claim 13, further comprising:
performing a read operation on the second data in response to the second read command when performing a cache output operation on the first data in response to the first cache output command, where the read operation and the cache output operation are performed by the nonvolatile memory device.

15. A method for operating a data storage device, comprising:
generating both a first read descriptor and a first cache output descriptor to obtain first data stored in a nonvolatile memory device;
queueing the first cache output descriptor when transmitting the first read descriptor to a memory controller;
determining whether a subsequent read operation on second data stored in the nonvolatile memory device is scheduled or not; and
determining whether to transmit the first cache output descriptor to the memory controller by referring to a state of clusters included in a buffer when a subsequent read operation is not scheduled.

16. The method according to claim 15, further comprising:
successively transmitting a second read descriptor for the second data and the first cache output descriptor to the memory controller when a subsequent read operation is scheduled.

17. The method according to claim 15, wherein the transmitting of the first cache output descriptor comprises:
transmitting the first cache output descriptor to the memory controller when a number of free clusters included in the buffer remains unchanged for a predetermined time.

18. The method according to claim 17, wherein the transmitting of the first cache output descriptor comprises:
keeping the first cache output descriptor queued when the number of free clusters does not remain unchanged for a predetermined time; and
checking again the number of free clusters when a subsequent read operation on the nonvolatile memory device is not scheduled.

* * * * *